(12) United States Patent
Fay et al.

(10) Patent No.: US 9,129,869 B2
(45) Date of Patent: Sep. 8, 2015

(54) PILLAR ON PAD INTERCONNECT STRUCTURES, SEMICONDUCTOR DEVICES INCLUDING SAME AND RELATED METHODS

(71) Applicant: Micron Technology, Inc., Boise, ID (US)

(72) Inventors: Owen R. Fay, Meridian, ID (US); Luke G. England, Tervuren (BE); Christopher J. Gambee, Caldwell, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/186,869

(22) Filed: Feb. 21, 2014

(65) Prior Publication Data

US 2014/0167259 A1    Jun. 19, 2014

Related U.S. Application Data

(63) Continuation of application No. 13/550,225, filed on Jul. 16, 2012, now Pat. No. 8,659,153.

(51) Int. Cl.
*H01L 21/4763* (2006.01)
*H01L 23/00* (2006.01)
(Continued)

(52) U.S. Cl.
CPC ............ *H01L 24/14* (2013.01); *H01L 21/0274* (2013.01); *H01L 21/311* (2013.01); *H01L 21/56* (2013.01); *H01L 23/291* (2013.01); *H01L 23/3192* (2013.01); *H01L 24/11* (2013.01); *H01L 24/13* (2013.01); *H01L 24/05* (2013.01); *H01L 24/16* (2013.01); *H01L 24/81* (2013.01); *H01L 25/0657* (2013.01);
(Continued)

(58) Field of Classification Search
USPC ................... 257/613, 737, 778; 438/618, 687
See application file for complete search history.

(56) References Cited

U.S. PATENT DOCUMENTS

| 6,407,451 B2 | 6/2002 | Akram et al. |
| 7,642,128 B1 | 1/2010 | Lin et al. |

(Continued)

FOREIGN PATENT DOCUMENTS

| JP | 10321630 A | 12/1998 |
| JP | 2001168129 A | 6/2001 |

(Continued)

OTHER PUBLICATIONS

International Search Report from the ISA/KR, International Application No. PCT/US2013/049021, Oct. 15, 2013, three (3) pages.
(Continued)

*Primary Examiner* — David Vu
*Assistant Examiner* — Brandon Fox
(74) *Attorney, Agent, or Firm* — TraskBritt

(57) ABSTRACT

Methods of fabricating interconnect structures for semiconductor dice comprise forming conductive elements in contact with bond pads on an active surface over a full pillar diameter of the conductive elements, followed by application of a photodefinable material comprising a photoresist to the active surface and over the conductive elements. The polyimide material is selectively exposed and developed to remove photodefinable material covering at least tops of the conductive elements. Semiconductor dice and semiconductor die assemblies are also disclosed.

24 Claims, 10 Drawing Sheets

(51) Int. Cl.
*H01L 21/027* (2006.01)
*H01L 21/311* (2006.01)
*H01L 23/29* (2006.01)
*H01L 23/31* (2006.01)
*H01L 21/56* (2006.01)
*H01L 25/065* (2006.01)

(52) U.S. Cl.
CPC .......... *H01L 2224/0401* (2013.01); *H01L 2224/05567* (2013.01); *H01L 2224/05647* (2013.01); *H01L 2224/1147* (2013.01); *H01L 2224/1191* (2013.01); *H01L 2224/11462* (2013.01); *H01L 2224/13005* (2013.01); *H01L 2224/13022* (2013.01); *H01L 2224/13083* (2013.01); *H01L 2224/13111* (2013.01); *H01L 2224/13147* (2013.01); *H01L 2224/13155* (2013.01); *H01L 2224/16238* (2013.01); *H01L 2224/8121* (2013.01); *H01L 2224/81191* (2013.01); *H01L 2224/81203* (2013.01); *H01L 2224/81815* (2013.01); *H01L 2225/06513* (2013.01); *H01L 2225/06541* (2013.01); *H01L 2225/06565* (2013.01); *H01L 2924/00014* (2013.01)

(56) References Cited

U.S. PATENT DOCUMENTS

| | | |
|---|---|---|
| 7,902,679 B2 | 3/2011 | Lin et al. |
| 2006/0094224 A1 | 5/2006 | Huang et al. |
| 2011/0084387 A1 | 4/2011 | Dubin et al. |
| 2011/0285013 A1* | 11/2011 | Chuang et al. ............... 257/737 |
| 2013/0069225 A1* | 3/2013 | Lin et al. ..................... 257/737 |
| 2014/0015124 A1 | 1/2014 | Fay et al. |

FOREIGN PATENT DOCUMENTS

| | | |
|---|---|---|
| JP | 4324572 B2 | 9/2009 |
| KR | 1019990060346 A | 7/1999 |

OTHER PUBLICATIONS

International Written Opinion of the International Searching Authority, ISA/KR, International Application No. PCT/US2013/049021, Oct. 15, 2013, ten (10) pages.

* cited by examiner

PILLAR ON PAD INTERCONNECT STRUCTURES, SEMICONDUCTOR DEVICES INCLUDING SAME AND RELATED METHODS

CROSS-REFERENCE TO RELATED APPLICATION

This application is a continuation of U.S. patent application Ser. No. 13/550,225, filed Jul. 16, 2012, now U.S. Pat. No. 8,659,153, issued Feb. 25, 2014, the disclosure of which is hereby incorporated herein in its entirety by this reference.

FIELD

Embodiments of the present disclosure relate to pillar on pad interconnect structures for semiconductor dice, semiconductor dice and die assemblies including such interconnect structures, and to related methods.

BACKGROUND

Increased circuit density is an ongoing goal of manufacturers of semiconductor devices. One long-favored configuration is an assembly of vertically stacked semiconductor dice, at least some of which are interconnected electrically and the stacked die assembly being mechanically and electrically connected to higher level packaging, such as an interposer or other substrate bearing conductive traces.

One configuration employing a plurality of stacked semiconductor dice is a Micropillar Grid Array Package ("MPGA"). Such a package comprises a stack of a plurality (for example four (4)) of dynamic random access (DRAM) semiconductor memory dice vertically interconnected from an uppermost die to a lowermost die, and a plurality of electrically conductive pillars extending from the underside of the lowermost memory die for connection to a logic die or a System on a Chip (SoC) die.

The provider of the logic die or the SoC die conventionally mounts their device to an interposer, such as a ball grid array (BGA) substrate, the logic or SoC die including conductive through vias for connection to the conductive pillars on the underside of the MPGA. The MPGA is mounted to the logic die or SoC die on the interposer and the assembly is then overmolded with an encapsulant into a finished Ball Grid Array (BGA) package.

The aforementioned configuration, implemented as a so-called "Wide I/O" memory device, enables fast memory access, and reduces power requirements.

One particularly promising configuration of an MPGA is a die assembly which incorporates a high-speed logic die below a vertical stack of DRAM dice interconnected with through-silicon vias (TSVs). The DRAM dice are configured specifically to only handle data, while the logic die provides all DRAM control within the die assembly. The design is expected to reduce latency, and greatly improve bandwidth and speed, while offering significantly reduced power demand and physical space requirements and providing flexibility for multiple platforms and application through use of different logic dice. One such implementation of a die assembly as described above may be characterized as a Memory Cube DRAM (MCDRAM) comprising a thermally conductive overmold over the DRAM dice and in contact with the logic die where it extends peripherally beyond the stack of DRAM dice. Another implementation of such a die assembly may be characterized as a Hybrid Memory Cube (HMC), wherein a lid is disposed over the stack of DRAM dice in peripheral contact with the logic die.

End products of the above designs will find a wide variety of applications including, among others, in mobile electronic devices such as so-called "smart phones," laptop and notebook computers, supercomputers, BLACKBERRY® devices, iPHONE® and iPAD® devices, and DROID® devices.

One significant concern with regard to implementation of the above-referenced designs is providing good adhesion, sufficient to withstand reliability stress testing, between bond pads of a semiconductor die and small diameter pillars at tight pitches employed to provide reliable electrical connections to another semiconductor die, interposer or other substrate above or below the semiconductor die in a stack.

Referring to FIG. 1, a conventional pillar on pad interconnect structure 100 for a semiconductor die 102 comprises an electrically conductive element 104 in the form of a pillar including a copper material 106 of about 30 µm diameter, a nickel material 108 thereover, and a solder material 110, such as a SnAg solder, over nickel material 108. Bond pad 112 on active surface 114 of semiconductor die 102 is surrounded by passivation material 116, for example, of at least one of $SiN_x$ and $SiO_x$. A polymer repassivation material 118 is located over passivation material 116, extending over bond pad 112 and leaving about a 9 µm diameter opening for contact of bond pad 112 with 30 µm diameter copper material 106. During the aforementioned stress testing, and as depicted in FIG. 2, due to the relatively small exposed surface area of bond pad 112 afforded by polymer repassivation material 118, copper material 106 of conductive element 104 lifts off bond pad 112, creating an open circuit OC between bond pad 112, which is in electrical contact with circuitry of semiconductor die 102, for example, conductive via 120. The limited structural support provided to conductive element 104 peripheral to the area of contact with bond pad 112 by the relatively soft and plastic nature of the polymer repassivation material 118 exacerbates the connectivity problem during thermocompression bonding employed to reflow solder material 110 to attach and electrically connect semiconductor die 102 to another component.

In a recent attempt by the inventors to remedy the above-referenced problem, which attempt is not admitted to be prior art or to otherwise comprise a public disclosure, 30 µm conductive elements were formed directly on bond pads in the absence of polymer repassivation material. However, when solder material was reflowed, the solder material wet along sides of the pillars past the nickel material and copper material to contact the bond pads, causing failure of the semiconductor dice due to formation of intermetallic compounds with the bond pad material, swelling of these compounds, and electrical shorting with circuitry under bond pads. In addition, in some instances the wetting of solder material down the pillars resulted in inadequate solder mass to connect to a landing pad on an adjacent component during reflow.

DETAILED DESCRIPTION

Figure 1:
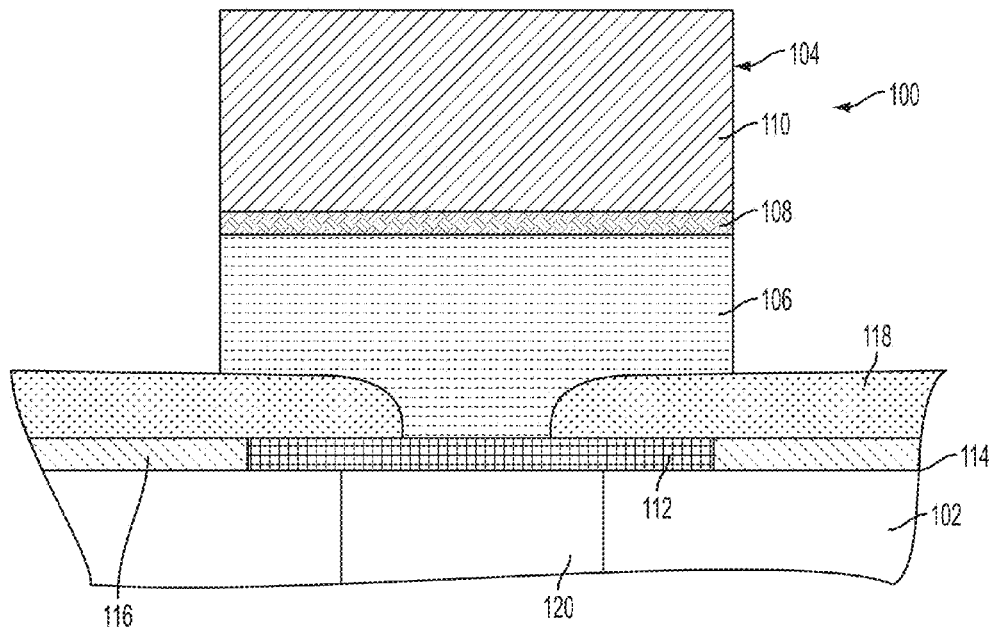
FIG. 1 is a schematic side sectional elevation of a portion of a semiconductor die having a conventional interconnect structure thereon.

Pillar on pad interconnect structures for semiconductor die assemblies are disclosed, as are semiconductor die assemblies including such interconnect structures, and methods of fabricating such interconnect structures. As used herein, the term "interconnect structures" means and includes bond pads and conductive elements formed thereon for electrical connection to other components, and associated materials and structures.

In the drawing figures, like elements and features are described by the same, or similar, reference numerals for clarity.

As used herein, the term "wafer" means and includes a volume of a semiconductor material in the form of a bulk semiconductor substrate, and is not limited to conventional, substantially circular wafers. As used herein, the term "semiconductor material" means and includes silicon, germanium, gallium arsenide, indium phosphide, and other III-V or II-VI type semiconductor materials. As used herein, the terms "semiconductor substrate," "semiconductor die" and "die" and plural forms thereof, mean and include a segment or segments of semiconductor material bearing integrated circuitry and singulated from a bulk semiconductor substrate. As used herein, the term "memory die" and plural forms thereof means and includes all forms of integrated circuit memory, including, by way of non-limiting example including DRAM, SRAM, Flash memory, and other memory forms.

As used herein, the term "major surface" means and includes one of an active surface and a back side of a wafer, a semiconductor substrate or a semiconductor die.

As used herein, the term "photodefinable material" means and includes materials formulated to alter one or more material characteristics responsive to exposure to radiant energy. Such material characteristics include, but are not limited to, material chemistry and structural characteristics, and specifically include relative solubility or lack thereof in a selected solvent. Examples of photodefinable materials include commercially available positive tone and negative tone photoresists, as well as materials in solution or suspension in carrier fluids as used to provide the aforementioned behavior in such photoresists. Examples of solvents include developers employed in conjunction with photoresists after exposure to radiant energy.

As employed herein, the terms "about" and "substantially," as used in connection with a given parameter, each mean and include variances from the designated value referenced for that particular parameter within normal manufacturing tolerances, material variations, accuracy of measuring instrumentation, consistency of controls, etc., as the case may be and as recognized by those of ordinary skill in the art.

The following description provides specific details, such as material types and processing conditions in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional semiconductor fabrication techniques employed in the industry. In addition, the description provided below does not form a complete process flow for manufacturing a semiconductor device. Only those process acts and structures necessary to understand the embodiments of the present disclosure are described in detail below. Additional acts to faun a complete semiconductor device from the semiconductor structures may be performed by conventional fabrication techniques.

In the following detailed description, reference is made to the accompanying drawings, which form a part hereof, and in which is shown, by way of illustration, specific embodiments in which the present disclosure may be practiced. These embodiments are described in sufficient detail to enable a person of ordinary skill in the art to implement embodiments of the present disclosure. However, other embodiments may be implemented, and structural, logical, and electrical changes encompassed by the disclosure may be made. The illustrations presented herein are not meant to be actual views of any particular semiconductor die or semiconductor device, but are merely idealized representations that are employed to more completely describe the embodiments of the present disclosure. The drawings presented herein are not necessarily drawn to scale. Additionally, elements common between drawings may retain the same or a similar numerical designation.

The following description of embodiments of method of the disclosure and related structures are characterized primarily, for clarity, with respect to a single interconnect structure formed on a semiconductor substrate. However, in practice the various embodiments may be performed for efficiency on a wafer scale, to form thousands of interconnect structures on hundreds of semiconductor dice residing on a wafer. Such wafer scale processing is well known to those of ordinary skill in the art and, so, will not be described in detail.

In one embodiment, a method of forming at least one interconnect structure comprises applying a photodefinable material to a first thickness on the surface of a semiconductor substrate surrounding a periphery of at least one conductive element protruding from the surface of the semiconductor substrate and to a second, lesser thickness over at least a top surface of the at least one conductive element, exposing the at least a top surface of the at least one conductive element to a dose of radiant energy sufficient to penetrate the second thickness of photodefinable material, and removing the second thickness of photodefinable material.

In another embodiment, a method of forming interconnect structures on an active surface of a semiconductor substrate comprises forming pillars comprising copper and a solder material on bond pads in contact with the bond pads over a full diameter of the pillars, spin coating a photodefinable material to a thickness over the active surface and to another, lesser thickness over the solder material of the pillars, and exposing the photodefinable material over the solder material to a dose of radiant energy substantially sufficient to penetrate the another thickness thereof.

In a further embodiment, a method of forming at least one interconnect structure comprises applying a photodefinable material to the surface of a semiconductor substrate surrounding a periphery of at least one conductive element protruding from the surface of the semiconductor substrate and over the at least one conductive element, exposing the surface of the semiconductor substrate to a dose of radiant energy sufficient to penetrate the photodefinable material while masking the photodefinable material over at top surface of the at least one conductive element, and removing the photodefinable material over the top surface of the at least one conductive element.

Referring now to FIGS. 3A through 5B of the drawings, embodiments of a method for fabricating an interconnect structure for a semiconductor die, and the resulting structure, is described.

Figure 3A:
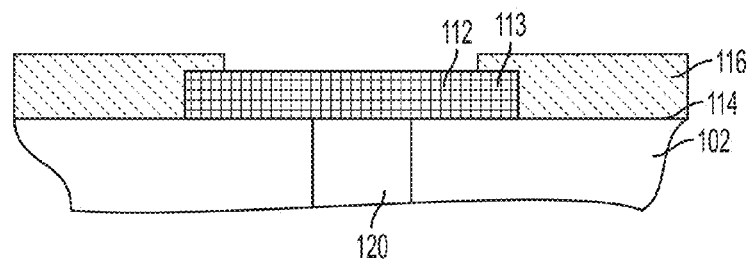
FIGS. 3A through 3C are schematic side sectional elevations of a portion of a method for fabricating an interconnect structure according to embodiments of the disclosure.

In FIG. 3A, a semiconductor die 102 comprises a bond pad 112 on active surface 114 surrounded by passivation material 116. Bond pad 112 may comprise a copper material and passivation material 116 may comprise, for example, at least one of $SiN_x$, $SiO_x$ and $SiO_xN_y$. In one embodiment, passivation material 116 may comprise $SiO_2$ and $Si_3N_4$, applied by a chemical vapor deposition (CVD) technique. Unlike the structure depicted in FIG. 1, passivation material 116 may extend over a lateral periphery 113 of bond pad 112 a short distance, for example, about 5 μm, leaving a substantial majority of the bond pad 112 exposed for formation of an electrically conductive element 104 (see FIG. 3B).

Figure 3B:
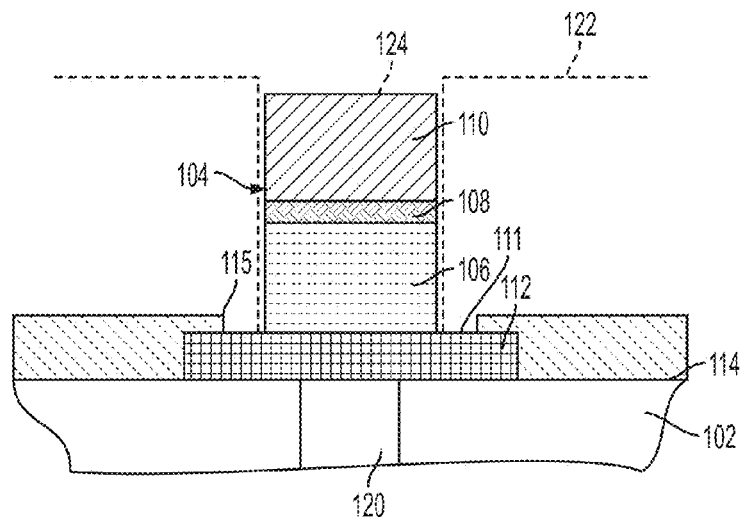

In FIG. 3B, electrically conductive element 104 (hereinafter referred to simply as "conductive element 104" for simplicity) may be formed by sequentially depositing copper material 106, optionally nickel material 108, and solder material 110 (e.g., SnAg) or other electroplatable material (e.g., Sn, SnCu) directly on bond pad 112, with a full conductive element lateral extent (e.g., diameter) of about 5 μm to about 70 μm, for example, about 30 μm, of copper material 106 in contact with the material of bond pad 112. In an embodiment, an annular area 111 of bond pad 112 remains exposed between conductive element 104 and an inner boundary 115 of passivation material 116. A positive or negative photoresist 122, as depicted in broken lines, is applied to a substantial thickness (for example, about 44 μm), patterned and developed to provide an aperture 124 for electroplating of the materials of conductive element 104 over a seed layer (not shown) deposited by physical vapor deposition (PVD) over active surface 114, as is conventional. Electroplated copper material 106 may, for example, comprise a height of between about 5 μm and about 15 μm. Electroplated nickel material 108 may, in some embodiments, be employed as a barrier layer to prevent formational of intermetallic compounds between copper material 106 and the tin of solder material 110. Nickel material 108 may comprise a thickness, for example, of about 3 μm. Electroplated solder material 110 may comprise a thickness, for example, of about 15 μm. As is clear from a review of FIGS. 6A through 6D, all material thicknesses for conductive element are approximate as the electroplated copper material 106, nickel material 108 and solder material 110 may, in practice, exhibit nonlinear (e.g., arcuate) boundaries between adjacent materials. After the electroplating processes are completed, photoresist 122 and the seed layer are then removed from active surface 114.

Figure 3C:
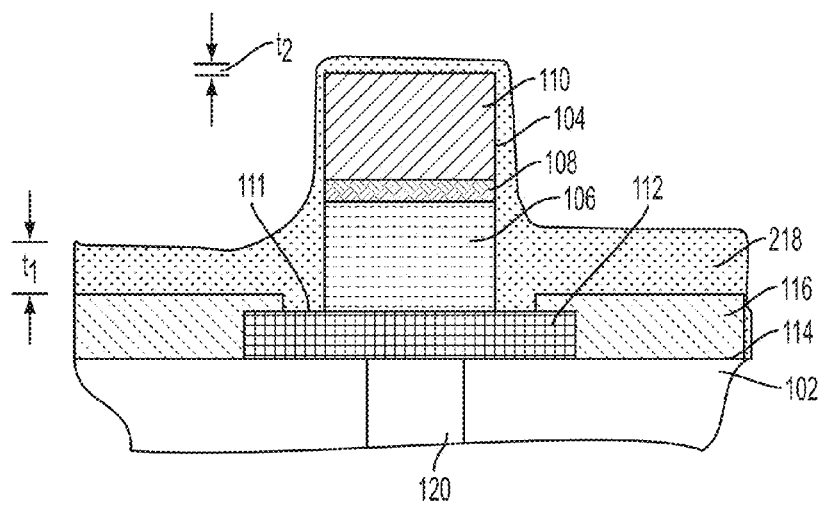

In FIG. 3C, after fabrication of conductive element 104 a photodefinable material 218 exhibiting dielectric (i.e., electrically insulative) properties and comprising, by way of non-limiting example, a positive tone photodefinable material such as a photoresist, is nonselectively applied over active surfaces 114, including any exposed area 111 of bond pad 112, to a first thickness $t_1$ of about 5 μum, also covering conductive element 104 to a second, lesser thickness $t_2$ of, for example, about 1 μm or less. Spin coating may be used to apply photodefinable material 218 over active surface, as the combination of centrifugal and gravitational forces may be used to reduce the thickness photodefinable material 218 over conductive element 104. The use of a relatively viscous photodefinable material 218 enables thinning over conductive element 104 while ensuring a sufficient thickness of photodefinable material 218 over active surface 114. The photodefinable material 218 may also be applied as a dry film using vacuum lamination, which technique also facilitates thinning of photodefinable material 218 over conductive element 104. Suitable dielectric materials for use in photodefinable materials include, for example, polyimides, epoxies, polybenzoxazole, and bezocyclobutene. Specific products which may be employed in an embodiment include, for example, WPR-5070 offered by JSR Micro, Inc. of Sunnyvale, Calif., and CRC-7561 offered by Sumitomo Bakelite Co., Ltd, Tokyo, Japan.

Figure 4A:
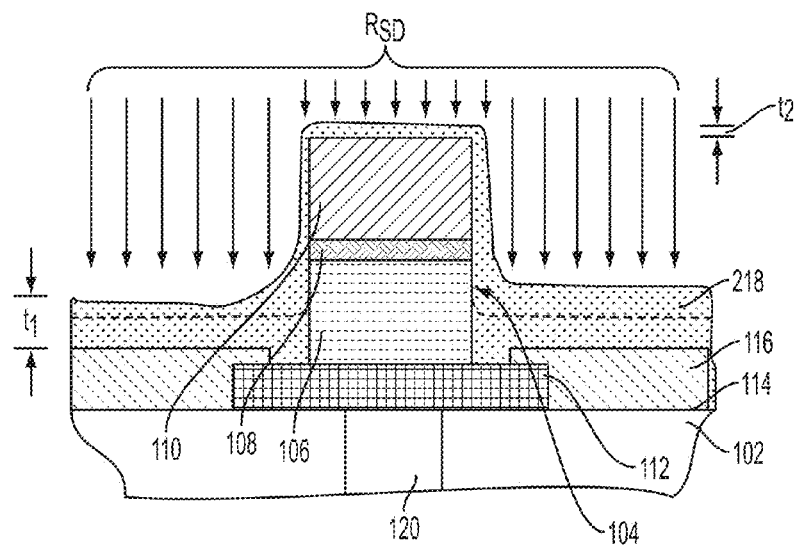
FIGS. 4A through 4C are schematic side sectional elevations of a remaining portion of a method for fabricating an interconnect structure according to some embodiments of the disclosure.

In FIG. 4A, and in one embodiment, after application of photodefinable material 218 to active surface 114 and conductive element 104, the photodefinable material 218 is exposed to a selected dose of broadband radiant energy $R_{SD}$ (for example) a mercury arc light source. The selected dose magnitude may be referred to as a "sub dose," and comprise a power magnitude of, for example, about twenty-five percent to about fifty percent of $E_0$, a radiant energy dose required to substantially completely remove a thickness of photodefinable material 218 from over active surface 114 by rendering it soluble in a developer. In terms of power, the sub dose applied to, for example, a polyimide-based photodefinable material 218 of about 5 μm thickness (i.e., $t_1$) may comprise an energy of about 150 mJ, whereas $E_0$=500 mJ. The broadband radiant energy may comprise G-H-I ultraviolet broadband exposure at wavelength peaks of 436 nm, 405 nm, and 365 nm, respectively. Employing a selected sub dose of broadband radiant energy $R_{SD}$ less than $E_0$ results in penetration of only part of the thickness $t_1$ of photodefinable material 218 as shown in a broken line, rendering only the penetrated portion soluble in and therefore removable by, a developer.

Figure 4B:
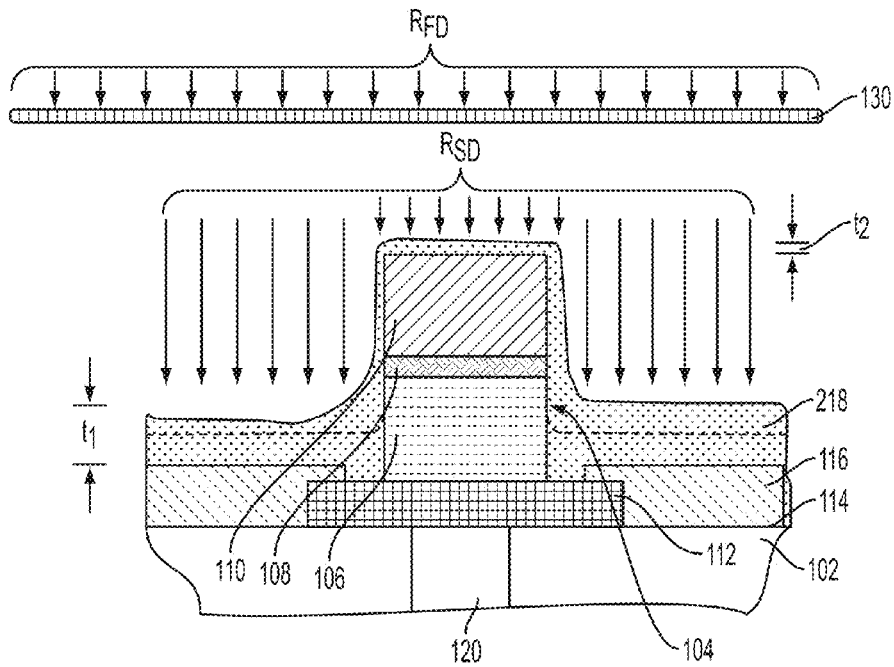

Instead of reducing power of radiant energy used for exposing photodefinable material, as shown in FIG. 4B, an energy source, such as the abovementioned mercury arc light source, may be used to produce a full dose of radiant energy $R_{FD}$ with a partially optically transmissive photomask 130, teamed a "leaky chrome" mask in the art, employed with a stepper to expose photodefinable material 218 on a group of semiconductor dice 102 to a reduced dose of radiant energy $R_{SD}$. Chrome is conventionally employed as a mask material to block transmission of light, and a leaky chrome mask comprises a checkerboard pattern of chrome or other mask material and open areas at extremely small resolution, for example, less than 1 μm, such as 0.5 μm or even 0.25 μm resolution. The coverage of semiconductor die 102 with a partially optically transmissive photomask 130 can be used to reduce the full dose of radian energy $R_{FD}$ to a suitable sub dose $R_{SD}$ by limiting radiant energy transmission using characteristic of the photomask to effect the desired energy reduction. Again, employing a selected sub dose of broadband radiant energy $R_{SD}$ less than $E_0$ results in penetration of only part of the thickness $t_1$ of photodefinable material 218, rendering only the penetrated portion soluble in and therefore removable by, a developer.

Figure 4C:
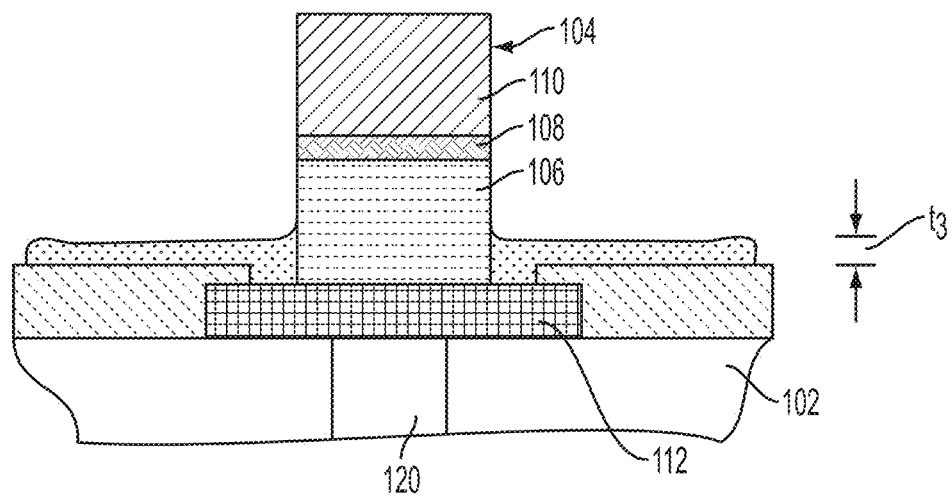

As shown in FIG. 4C, after exposure to the sub dose of radiant energy, positive photodefinable material 218 is developed. The lesser thickness $t_2$ of photodefinable material 218 over and about the side of conductive element 104, having been substantially completely penetrated by radiant energy sub dose $R_{SD}$ and exposed, is then removed. However, due to the reduced magnitude of radiant energy $R_{SD}$, the full thickness $t_1$ of photodefinable material 218 over active surface 114 and surrounding conductive element 104 has not been penetrated and exposed. As a result, when the exposed part of the thickness $t_1$ of photodefinable material 218 is developed and dissolved, an unexposed thickness $t_3$ remains over active surface 114, surrounding and in contact with conductive element 104.

Figure 5A:
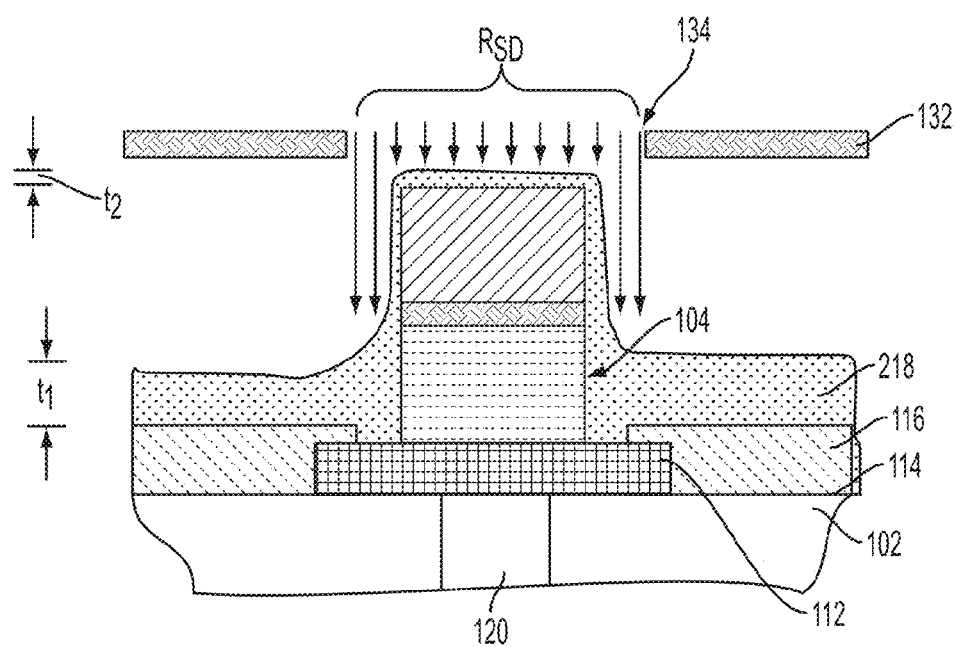
FIGS. 5A and 5B are schematic side sectional elevations of a remaining portion of a method for fabricating an interconnect structure according to other embodiments of the disclosure.

In FIG. 5A, and in another embodiment, after application of photodefinable material 218 to active surface 114 and conductive element 104, the photodefinable material 218 over and adjacent conductive element 104 is exposed through an aperture 134 in an opaque mask 132 to a sub dose of broadband radiant energy $R_{SD}$ from (for example) a mercury arc light source sufficient to remove a thickness $t_2$ of photodefinable material 218 from the top of conductive element 104. In terms of power, the dose applied may, again, be an energy of about 150 mJ, whereas $E_0$=500 mJ. Again, the selected sub dose of radiant energy $R_{SD}$ results in penetration and exposure of only part of the thickness $t_1$ of photodefinable material 218.

Of course, a full dose of radiant energy $R_{FD}$ may also be employed if a dimension and alignment of aperture 134 with conductive element 104 sufficiently blocks exposure of surrounding photodefinable material 218. As other alternatives, a full dose of radiant energy $R_{FD}$ may be employed with an opaque mask 132 having a partially optically transmissive portion aligned over conductive element 104, or a partially optically transmissive mask 130 (FIG. 4B) with an aperture 134 aligned over conductive element 104 may be employed. Radiant energy power employed, as well as the mask 130, may be selected to remove photodefinable material 218 from over conductive element 104 while providing desired remaining thickness of photodefinable material 218 surrounding and in contact with conductive element 104.

Figure 5B:
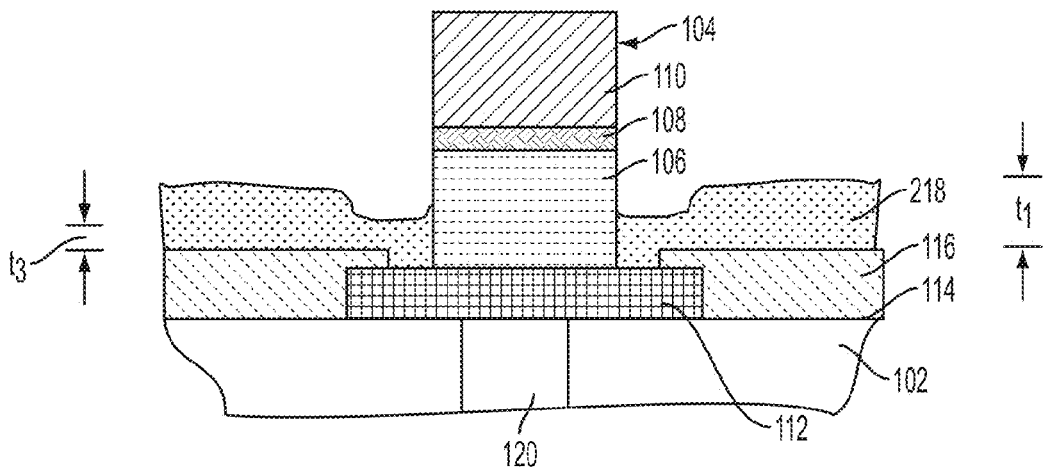

As shown in FIG. 5B, after exposure to the sub dose of radiant energy $R_{SD}$, photodefinable material 218 is developed. The thickness $t_2$ of photodefinable material 218 over and about the side of conductive element 104, having been substantially completely exposed, is then removed. However, due to the blockage of radiant energy by opaque mask 132, the full thickness $t_1$ of polymide material 218 over active surface 114 and surrounding conductive element 104 has not been exposed except immediately adjacent conductive element 104. As a result, when photodefinable material 218 is developed, an unexposed thickness $t_3$ remains, surrounding and in contact with conductive element 104, while the full thickness $t_1$ of masked photodefinable material 218 resides over a remainder of active surface 114.

Thus, one embodiment comprises an interconnect structure for a semiconductor substrate, comprising a bond pad, a conductive element comprising a pillar on and in direct contact with the bond pad over a full diameter of the pillar, a solder material on an end of the pillar opposite the bond pad, and a photodefinable material over a portion of the bond pad around and in contact with the pillar.

Figure 6A:
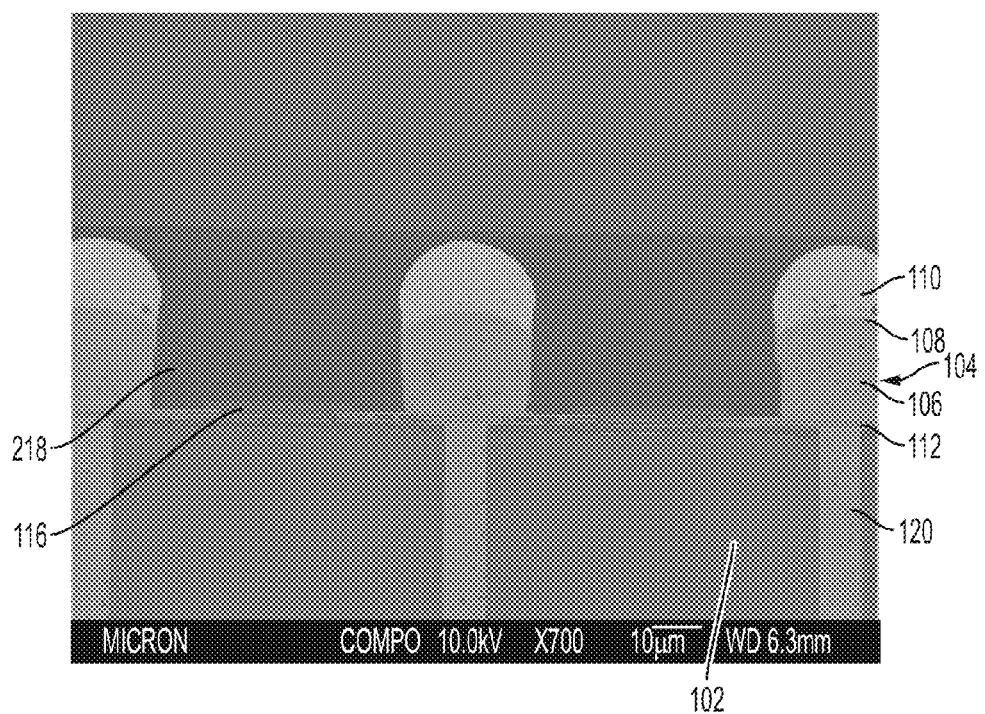
FIGS. 6A through 6C are sectional photomicrographs of portions of a semiconductor die having interconnect structures formed thereon according to an embodiment of the disclosure.
Figure 6B:
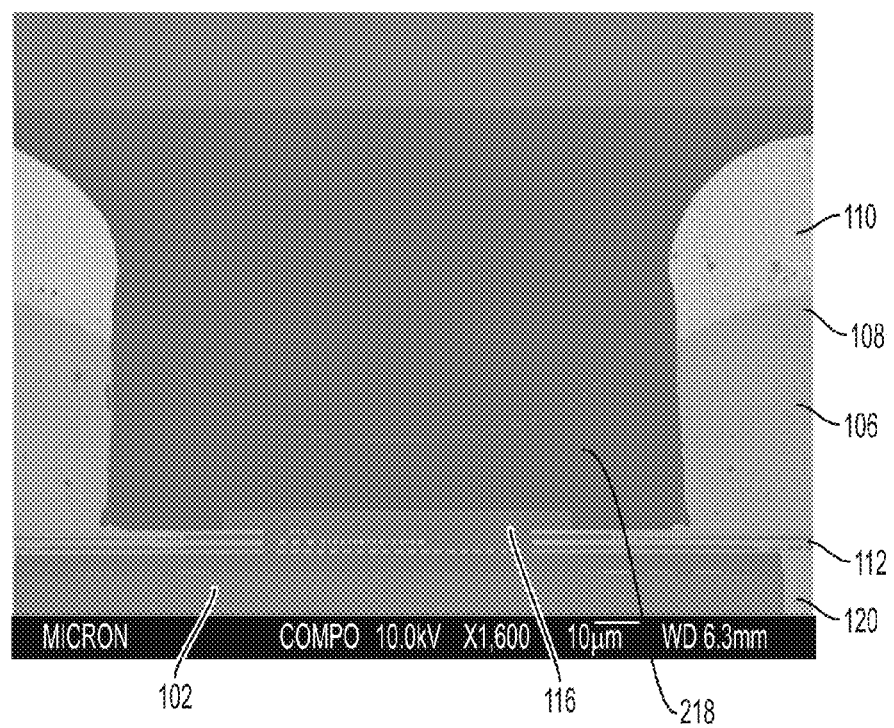
Figure 6C:
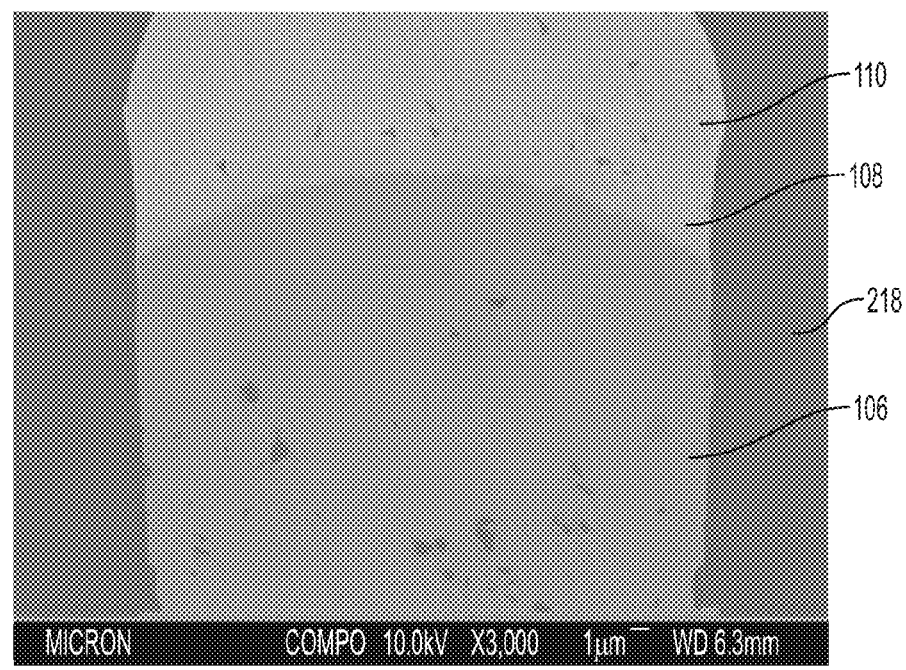
Figure 6D:
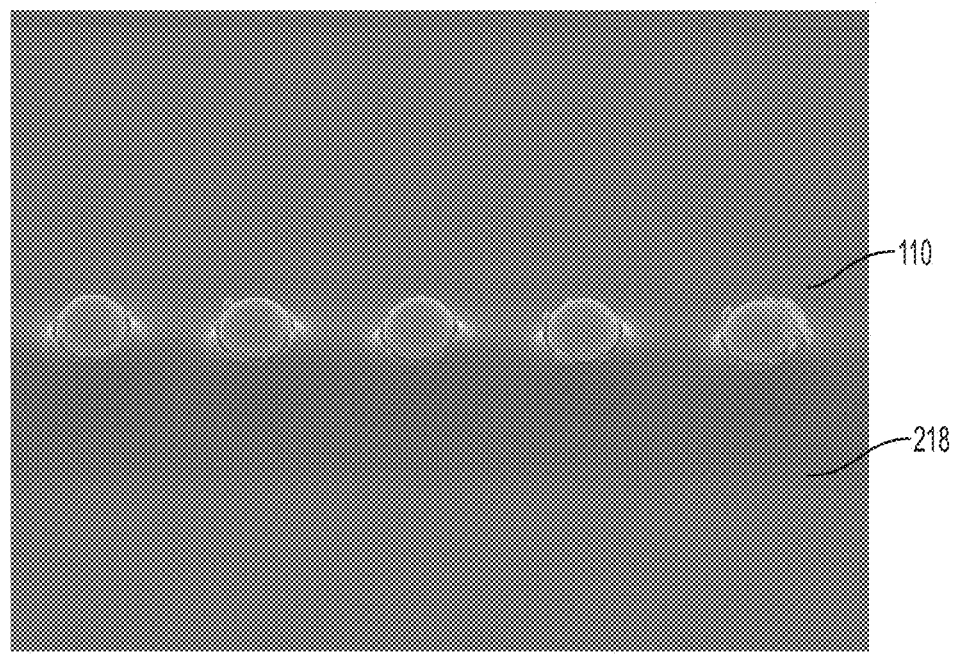
FIG. 6D is a perspective photomicrograph of a semiconductor die having interconnect structures formed thereon according to an embodiment of the disclosure.

FIG. 6A depicts several conductive elements 104 processed according to the embodiment of FIGS. 4A and 4B on a semiconductor die 102 residing on bond pads 112 in communication with TSVs 120 and with passivation material 116 between bond pads 112 and photodefinable material 218 surrounding and adjacent conductive elements 104. FIG. 6B is an enlargement of FIG. 6A and depicts portions of two adjacent conductive elements 104, while FIG. 6C is an enlarged view of a single conductive element 104 showing copper material 106, nickel material 108 and solder material 110 surrounded by photodefinable material 218 surrounding conductive element 104 to a height above a boundary of nickel material 108 with solder material 110. However, it may be desirable to control process parameters during exposure of photodefinable material 218 to maintain a height of photodefinable material 218 to substantially the height of copper material 106, enabling all of solder material 110 to protrude above photodefinable material 218 and enhance the formation of an interconnect with a landing pad 140 (see FIG. 7) on another component. FIG. 6D is a perspective view of a row of conductive elements 104 surrounded by photodefinable material 218.

In one such an embodiment, a semiconductor substrate comprises semiconductor material comprising integrated circuitry and having bond pads on an active surface thereof, conductive elements comprising metal pillars on and in direct contact with the bond pads over a full diameter of the pillars, a solder material on each metal pillar, and a photodefinable material over the active surface surrounding and at least in contact with the metal pillars.

Figure 7:
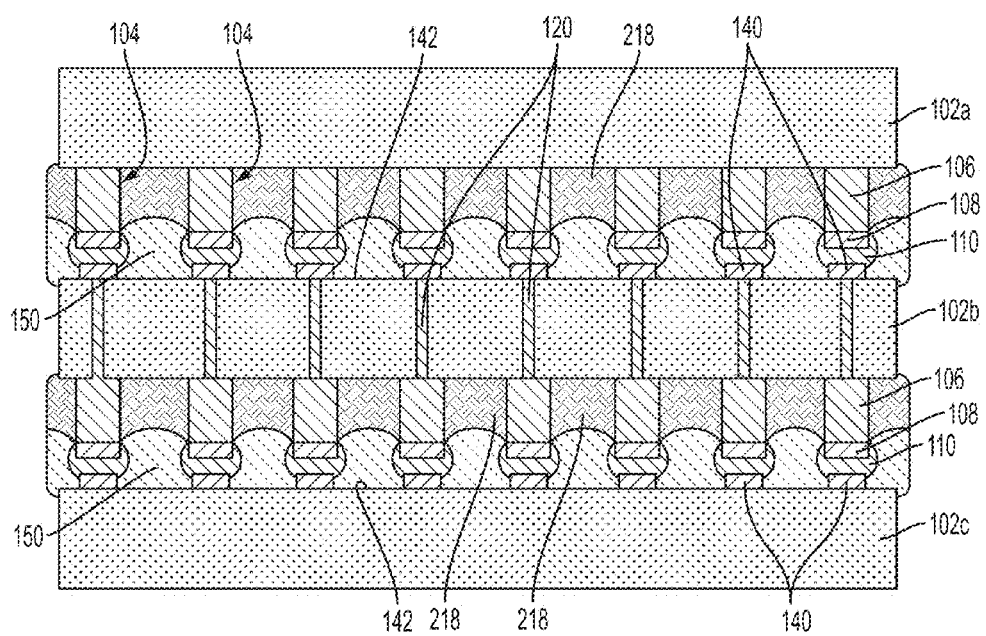
FIG. 7 is a schematic side sectional elevation of a die assembly employing interconnect structures according to embodiments of the disclosure.

FIG. 7 depicts a die assembly formed by connection of mutually adjacent semiconductor dice 102a 102b and 102c after inversion of semiconductor die 102a and semiconductor die 102b for so-called "flip chip" bonding by reflow of solder material 110 of conductive elements 104 to respectively connect to landing pads 140 on back sides 142 of semiconductor dice 102b and 102c using thermocompression bonding. If an SnAg solder material 110 is employed, the interconnect between conductive elements 104 and landing pads 140 is formed by reflowing (i.e., melting) the solder material 110 at a temperature, for example, of about 250° C. to bond the copper material 106 of conductive elements 104 to the landing pads 140. As an alternative to thermocompression bonding, after inversion of semiconductor dice 102, 102a, and 102b, solder material 110 of conductive elements 104 may be dipped in flux and placed in contact with landing pads 140 and the die assembly placed in an oven for reflow. A dielectric underfill material 150 is located between semiconductor dice 102a, 102b and 102c, surrounding conductive elements 104 and primarily solder material 110, as photodefinable material 218 surrounds at least copper material 106 of conductive elements 104.

An embodiment, as described above, may be characterized as a semiconductor die assembly comprising a semiconductor die having bond pads on a major surface thereof, and conductive pillars located on the bond pads, another semiconductor die having landing pads on a major surface thereof, and landing pads connected to the conductive pillars with a solder material, a dielectric photodefinable material over the major surface of the semiconductor die and surrounding and in contact with the conductive pillars, and a dielectric material over the major surface of the another semiconductor die, in contact with the photodefinable material and laterally surrounding at least a portion of the solder material connecting the conductive pillars to the landing pads.

Figure 2:
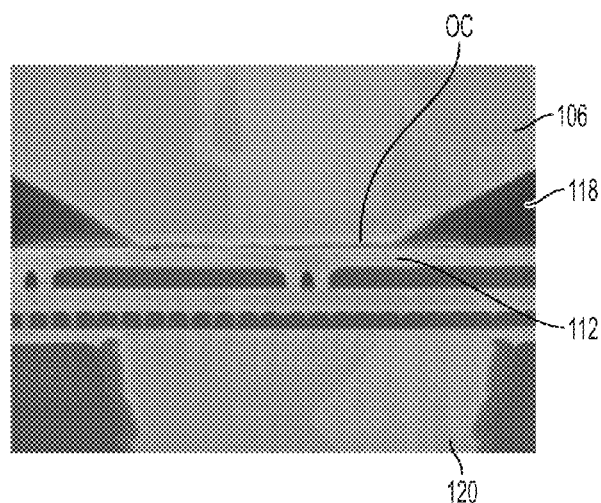
FIG. 2 is a section of a 25,000× photomicrograph of a failed interconnect structure of the type of FIG. 1 after reliability stress testing of a semiconductor die.

In testing of die assemblies incorporating interconnect structures according to embodiments of the disclosure and as are described herein with respect to FIG. 7 in comparison to die assemblies employing conventional pillar on pad structures as illustrated in FIGS. 1 and 2, yields of functional semiconductor dice after reliability stress testing of two-high die stacks using a Highly Accelerated Stress Test (HAST) and Temperature Cycle (TMCL) test have been increased in excess of ten percent (10%).

Photodefinable material comprising, for example, a photoresist has been described herein to be a so-called "positive" tone material that, when exposed to radiant energy of one or more suitable wavelengths and then developed, may be removed. However, the inventors herein contemplate that the techniques described herein may also be implemented using a "negative" tone photodefinable material in conjunction with a skeleton mask to cover primarily the tops of pillar-type conductive elements during exposure of a wafer comprising photodefinable material-coated semiconductor dice to radiant energy, such exposure being followed by developing using a positive developer. In such a situation, the unexposed photodefinable material covering the tops of the conductive elements is removed, leaving the exposed, developed photodefinable material over at least portions of the sides of the conductive elements as well as the bond pads and surrounding passivation material.

While the disclosure is susceptible to various modifications and alternative forms, specific embodiments have been shown by way of example in the drawings and have been described in detail herein. However, the disclosure is not intended to be limited to the particular forms disclosed. Rather, the disclosure encompasses all modifications, equivalents, and alternatives falling within the scope of the disclosure as defined by the following appended claims and their legal equivalents.

What is claimed is:

1. A method of forming a semiconductor device, comprising:
   forming conductive elements in contact with at least some bond pads over a full lateral extent of each conductive element contacting an associated bond pad;
   applying a photodefinable material to a first thickness over an exposed area of the bond pads and to a second, lesser thickness over top surfaces of the conductive elements;
   exposing the top surfaces of the conductive elements to a dose of radiant energy sufficient to penetrate the second thickness of photodefinable material; and
   removing the second thickness of photodefinable material.

2. The method of claim 1, wherein removing the second thickness of photodefinable material comprises dissolving the penetrated photodefinable material.

3. The method of claim 1, further comprising blocking exposure of the first thickness of photodefinable material to the dose of radiant energy other than immediately adjacent the conductive elements.

4. The method of claim 3, wherein the dose of radiant energy is sufficient to penetrate only part of the exposed first thickness of photodefinable material, and further comprising removing the penetrated part of the first thickness of photodefinable material.

5. The method of claim 1, wherein the dose of radiant energy is sufficient to penetrate only part of the first thickness of photodefinable material, and further comprising exposing the first thickness of photodefinable material to the dose of radiant energy and removing the penetrated part of the first thickness of photodefinable material.

6. The method of claim 5, wherein removing the second thickness of photodefinable material and the penetrated part of the first thickness of photodefinable material comprises dissolving the photodefinable material.

7. The method of claim 5, further comprising producing the dose of radiant energy by controlling power output from a source of the radiant energy.

8. The method of claim 5, further comprising producing the dose of radiant energy by reducing transmission of the radiant energy from a source of the radiant energy using a partially transmissive photomask.

9. The method of claim 1, further comprising forming the conductive elements with the top surfaces comprising a solder.

10. The method of claim 1, further comprising forming the conductive elements comprising:
    forming a seed material on the bond pads;
    patterning a photoresist over the seed material with apertures aligned over the bond pads;
    electroplating in the aperture:
      a copper material;
      a nickel material over the copper material;
      and a solder material over the nickel material; and
    removing the photoresist and the seed material over the substrate and around the conductive elements.

11. The method of claim 1, wherein the photodefinable material comprises a material selected from the group consisting of polyimides, epoxies, polybenzoxazole, and bezocyclobutene.

12. The method of claim 1, further comprising applying the photodefinable material by one of spin coating and dry film vacuum lamination.

13. A method of forming an interconnect structure, comprising:
    forming conductive elements in contact with bond pads, the contact being over a full lateral extent of each conductive element contacting a bond pad, on a surface of a substrate;
    applying a photodefinable material over the conductive elements and over an exposed area of the bond pads surrounding a periphery of the conductive elements; and
    removing the photodefinable material from only over top surfaces of the conductive elements.

14. The method of claim 13, wherein removing the photodefinable material only over the top surfaces of the conductive elements comprises exposing the surface of the substrate to a dose of radiant energy sufficient to penetrate the photodefinable material while masking the photodefinable material over the top surfaces of the conductive elements.

15. The method of claim 13, wherein removing the photodefinable material only over the top surfaces of the conductive elements comprises dissolving the photodefinable material.

16. A semiconductor substrate, comprising:
    bond pads on an active surface thereof;
    conductive elements in direct contact with the bond pads, each bond pad in contact with a corresponding conductive element over a full diameter of the corresponding conductive element; and
    a photodefinable material over the active surface surrounding and in contact with the conductive elements and surfaces of the bond pads between the conductive elements and a passivation material around the bond pads.

17. The semiconductor substrate of claim 16, wherein the photodefinable material comprises a dielectric material selected from the group consisting of polyimides, epoxies, polybenzoxazole, and bezocyclobutene.

18. A semiconductor device, comprising:
    a first semiconductor die having bond pads and conductive pillars located on the bond pads;
    a second semiconductor die having landing pads connected to the conductive pillars with a solder material;
    a dielectric photodefinable material over the first semiconductor die surrounding and in contact with the conductive pillars; and
    a dielectric material over the second semiconductor die, in contact with the dielectric photodefinable material and laterally surrounding a portion of the solder material.

19. The semiconductor device of claim 18, wherein each conductive pillar comprises copper and is in direct contact with a bond pad over an entirety of a lateral extent of that conductive pillar.

20. The semiconductor device of claim 18, wherein the dielectric photodefinable material comprises one of a polyimide, an epoxy, polybenzoxazole, and bezocyclobutene.

21. The semiconductor device of claim 18, wherein the dielectric photodefinable material comprises one of a positive tone material and a negative tone material.

22. A semiconductor device, comprising:
   bond pads;
   conductive elements in direct contact with at least some of the bond pads each bond pad in contact with a corresponding conductive element over a full diameter of the corresponding conductive element; and
   a photodefinable material over surfaces of the bond pads between the conductive elements and a passivation material located around the bond pads, the photodefinable material surrounding and contacting peripheries of the conductive elements.

23. The semiconductor device of claim 22, further comprising a solder material on ends of the conductive elements opposite the bond pads.

24. The semiconductor device of claim 22, wherein the photodefinable material comprises a dielectric material selected from the group consisting of polyimides, epoxies, polybenzoxazole, and bezocyclobutene.

\* \* \* \* \*